(12) United States Patent
Kim et al.

(10) Patent No.: US 7,979,761 B2
(45) Date of Patent: Jul. 12, 2011

(54) MEMORY TEST DEVICE AND MEMORY TEST METHOD

(75) Inventors: Bum-keun Kim, Yongin-si (KR); Kyung-young Kim, Suwon-si (KR); Jung-hwan Oh, Suwon-si (KR); Beom-seok Lee, Hwaseong-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 161 days.

(21) Appl. No.: 12/331,701

(22) Filed: Dec. 10, 2008

(65) Prior Publication Data

US 2009/0307544 A1 Dec. 10, 2009

(30) Foreign Application Priority Data

Jun. 9, 2008 (KR) .................. 10-2008-0053786

(51) Int. Cl.
*G11C 29/00* (2006.01)
(52) U.S. Cl. ......... 714/719; 714/718; 714/723; 365/201
(58) Field of Classification Search .................. 714/719, 714/718, 723; 365/201
See application file for complete search history.

(56) References Cited

U.S. PATENT DOCUMENTS

| | | | | |
|---|---|---|---|---|
| 6,516,410 | B1* | 2/2003 | Heller | 713/2 |
| 6,807,616 | B1* | 10/2004 | McGrath et al. | 711/206 |
| 7,325,176 | B2* | 1/2008 | Larson et al. | 714/718 |
| 2004/0068679 | A1* | 4/2004 | Vellolil et al. | 714/42 |
| 2005/0149898 | A1* | 7/2005 | Hakewill et al. | 716/18 |

OTHER PUBLICATIONS

Sun et al., An Efficient Functional Test for the Massively-Parallel C*RAM Logic-Enhanced Memory Architecture, Nov. 3-5, 2003, IEEE, pp. 475-482.*

* cited by examiner

*Primary Examiner* — John J Tabone, Jr.
(74) *Attorney, Agent, or Firm* — Jefferson IP Law, LLP

(57) ABSTRACT

A memory test device, including a universal register to conduct an operation by a predetermined universal command language; an extension register having a larger capacity than the universal register and to conduct an operation by a predetermined extension command language; and a controller to write a predetermined test pattern in an external memory using the extension command language, to read the test pattern written in the memory, to determine the identity of the written test pattern and the read test pattern, and to determine a presence of an error in the memory using the universal command language.

20 Claims, 5 Drawing Sheets

FIG. 5

| | TEST CONTENT | TIME(sec) | | | IMPROVED TIME RATE(%) | | IMPROVED SPEED RATE% | |
|---|---|---|---|---|---|---|---|---|
| | | 32-BIT | 64-BIT | 128-BIT | 64-BIT | 128-BIT | 64-BIT | 128-BIT |
| 1 | WRITE | 1.87 | 1.22 | 0.98 | 34.8 | 47.6 | 53.3 | 90.8 |
| 2 | READ (CACHE O) | 0.54 | 0.32 | 0.21 | 40.7 | 61.1 | 68.8 | 157.1 |
| 3 | READ (CACHE X) | 0.91 | 0.77 | 0.54 | 15.4 | 40.7 | 18.2 | 68.5 |
| 4 | PATTERN TEST | 12.58 | 9.89 | 5.98 | 21.4 | 52.5 | 27.2 | 110.4 |
| 5 | ADDRESS LINE TEST | 2.80 | 1.76 | 0.93 | 37.1 | 66.8 | 59.1 | 201.1 |
| 6 | WORKING I/O TEST | 28.20 | 22.12 | 12.98 | 21.6 | 54.0 | 27.5 | 117.3 |
| 7 | CHECK BOARD TEST | 5.67 | 4.59 | 3.32 | 19.0 | 41.4 | 23.5 | 70.8 |

MEMORY TEST DEVICE AND MEMORY TEST METHOD

CROSS-REFERENCE TO RELATED APPLICATION

This application claims the benefit of Korean Patent Application No. 2008-53786 filed in the Korean Intellectual Property Office on Jun. 9, 2008, the disclosure of which is incorporated herein by reference.

BACKGROUND OF THE INVENTION

1. Field of the Invention

Aspects of the present invention relate to a memory test device and a memory test method, and more particularly to a memory test device comprising an extension register and a memory test method using the same.

2. Description of the Related Art

In general, detection of errors in a memory to thereby reduce the error rate is an important process for memory producers and electronic apparatus producers producing and selling their products employing the memories produced by the memory producers. As memory has had a small capacity in the past, a memory test process was not as time consuming in the entire production process as compared to other production processes.

However, the storage capacity of a memory has exponentially increased owing to recent development in hardware technology. Thus, an error test in the memory has become an important issue, because error testing is directly associated with the productivity of the memory industry. For example, if it takes 20 minutes to detect errors in a 128 MB memory, the time to detect errors in a 1 GB memory would be simply computed at 160 minutes. As CPU performance, memory access time, bandwidth, etc. have increased, it would be difficult to assert that the testing process simply takes eight times longer. However, the test time would be approximately 2-5 times or longer.

A conventional memory test widely used and commercially available at present is executed in the unit of 32 bits (4 bytes). As the 32-bit test employs the most universalized computer command language and the same data processing unit, it is excellent in compatibility and universality. However, where the test bit number is increased in order to reduce the memory test time, a separate test device capable of supporting the increased data and command language is required.

SUMMARY OF THE INVENTION

Aspects of the present invention provide a test memory device and a test memory method, capable of reducing the test time.

Additional aspects of the present invention provide a test memory device and a test memory method, having excellent compatibility and universality.

According to an aspect of the present invention a memory test device to test an external memory is provided. The memory test device includes: a universal register to conduct an operation by a predetermined universal command language; an extension register having a larger capacity than the universal register, to conduct an operation by a predetermined extension command language; and a controller to write a predetermined test pattern in the external memory using the extension command language, to read the test pattern written in the memory, to compare the written test pattern and the read test pattern, and to determine a presence of an error in the external memory according to the comparison using the universal command language.

According to another aspect of the present invention, the universal register has a predetermined capacity of N bytes, where N is an integer, and the controller writes and read the test pattern of N*M bytes, where M is an integer greater than 1.

According to another aspect of the present invention, the controller determines the identity of the written test pattern and the read test pattern in an N-byte unit, and writes in the extension register a register value indicating whether the test patterns match as determined in the N-byte unit.

According to another aspect of the present invention, the controller writes in the universal register information on whether the written test pattern matches the read test pattern, based on the register value written in the N-byte unit.

According to another aspect of the present invention, the controller writes in the universal register a register value of a single bit among the written N-byte register values.

According to another aspect of the present invention, the controller determines an address of the memory having an error generated therein, based on the register value written in the universal register.

According to another aspect of the present invention, the extension command language is realized by an SIMD (single instruction multiple data) operation.

According to another aspect of the present invention, the extension command language includes at least one of MMX (multimedia extension), SSE (steaming SIMD extension), SSE2, and/or SSE3.

According to another aspect of the present invention, the extension register includes at least one of an MMX register and/or an XMM (extended memory manager) register.

According to another aspect of the present invention a memory test method is provided, using a test memory device including a universal register to conduct an operation by a predetermined universal command language, and an extension register having a larger capacity than the universal register and to conduct an operation by a predetermined extension command language. The method includes: writing a predetermined test pattern in an external memory using the extension command language; reading the test pattern written in the external memory using the extension command language; comparing the written test pattern and the read test pattern; and determining any error in the memory based on the comparison, using the universal command language.

According to another aspect of the present invention, the comparing includes: determining whether the written test pattern matches the read test pattern; and writing in the extension register a register value indicating whether the test patterns are identical as determined in the N-byte unit.

According to another aspect of the present invention, the determining of the error in the memory includes: writing in the universal register information on the identity of the written test pattern and the read test pattern, based on the register value written in the N-byte unit; and determining an address of the external memory having an error generated therein based on the information written in the universal register.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 5 is a table showing effects of a test memory method according to FIGS. 3 and 4.

DETAILED DESCRIPTION OF THE EMBODIMENTS

Figure 1:
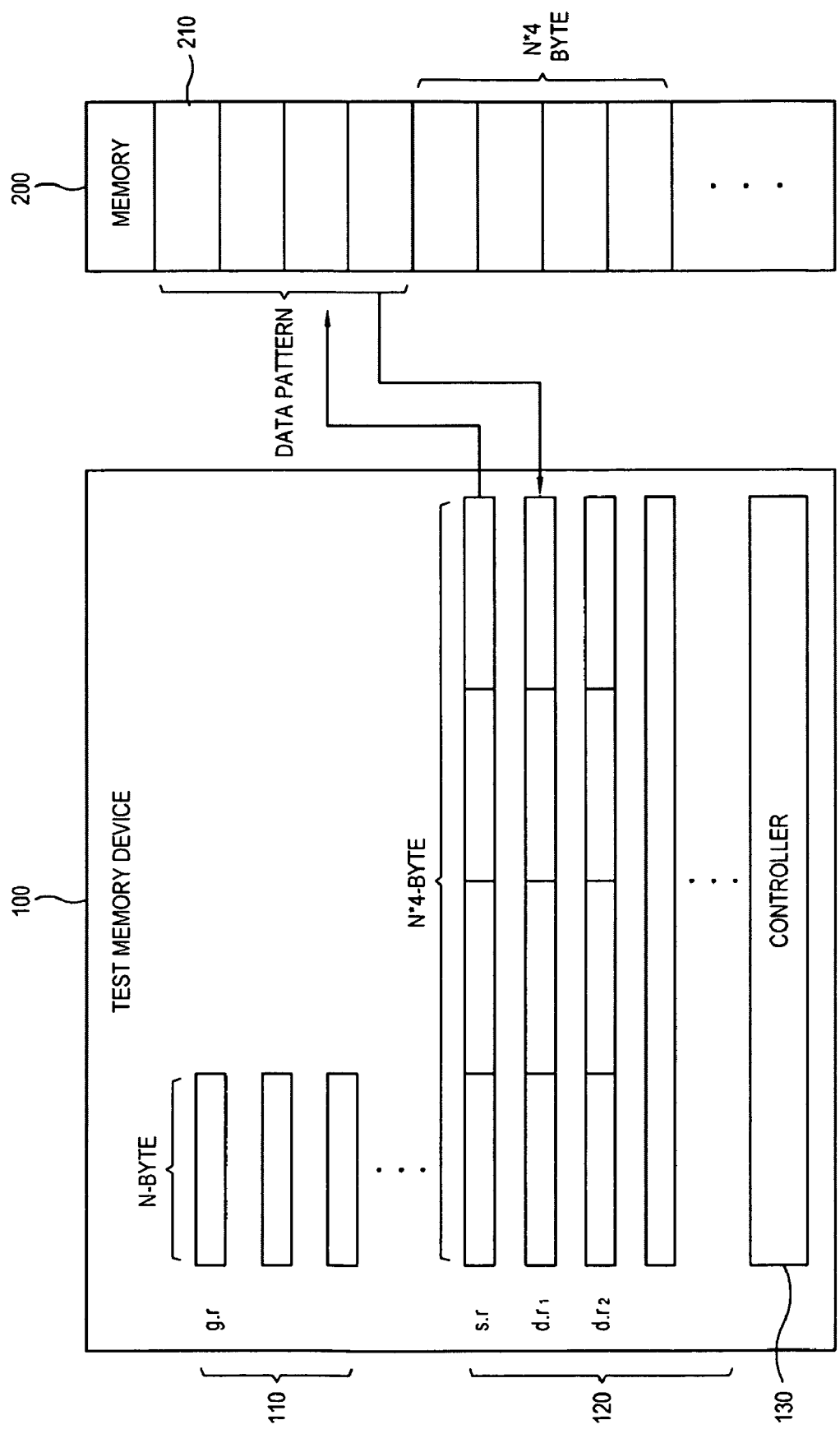
FIG. 1 is a control block diagram of a memory test device and a memory according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a control block diagram of a memory test device 100 and a memory 200 according to an embodiment of the present invention. The memory test device 100 comprises an operation device, which is included in a computer system and can process data based on certain command languages, such as a processing unit or a central processing unit (CPU). The memory test device 100 comprises registers as storage units of various sizes. As shown in FIG. 1, the memory test device 100 comprises a universal register 110 having a capacity of N bytes and an extension register 120 having a larger capacity than the universal register 110. The universal register 110 conducts a data operation by the universal command language. The computer command language may be based on 32 bits, i.e., N=4 bytes, and thus, the universal register 110 as shown in FIG. 1 is a 4-byte register. However, the universal register 110 according to other aspects of the present invention is not limited to 4-byte registers and may be of any appropriate size.

As shown in FIG. 1, the extension register 120 has a size of N*4 bytes, or 128 bits (where N=4), and conducts an operation by the extension command language. The extension command language is a language to process data faster than the universal command language currently used, and may be one of MMX (multimedia extension), SSE (streaming SIMD extensions), SSE2, and/or SSE3, developed by Intel Corporation of the United States of America without limitation thereto. These extension command languages were developed to realize more effectively multimedia functions for which an SIMD (Single Instruction Multiple Data) operation for rapid data processing is conducted, as in games, moving pictures, 3-dimensional images, and the like. The SIMD operation is a technique to process multi data with a single command language, and can advantageously process more data at a time. It is the extension register 120 that is to be used to conduct the SIMD operation. The extension register 120 may be realized by, for example, at least one of an MMX register and/or an XMM (extended memory manager) register.

Although not shown, the memory test device 100 may comprise an N*2 register or other registers having larger bytes, in addition to the N*4-byte extension register 120. The memory 200 being tested is sectioned into a plurality of addresses 210, in which predetermined data patterns are written for a memory test. The greater a capacity of the memory 200, the more data patterns are to be written. For this reason, more time is consumed in the memory test. To reduce the test time, the size of data patterns written at a time should be large.

A controller 130 writes and reads the predetermined test patterns in the memory 200 using the extension command language, and determines the identity of the test patterns written and read. In addition, the controller 130 determines an address 210 of the memory 200 generating an error therein, using the universal command language. The controller 130 generally indicates a processing entity to process data by controlling and executing a command language for the memory test, and can be implemented using hardware, processors, and the like.

Figure 2:
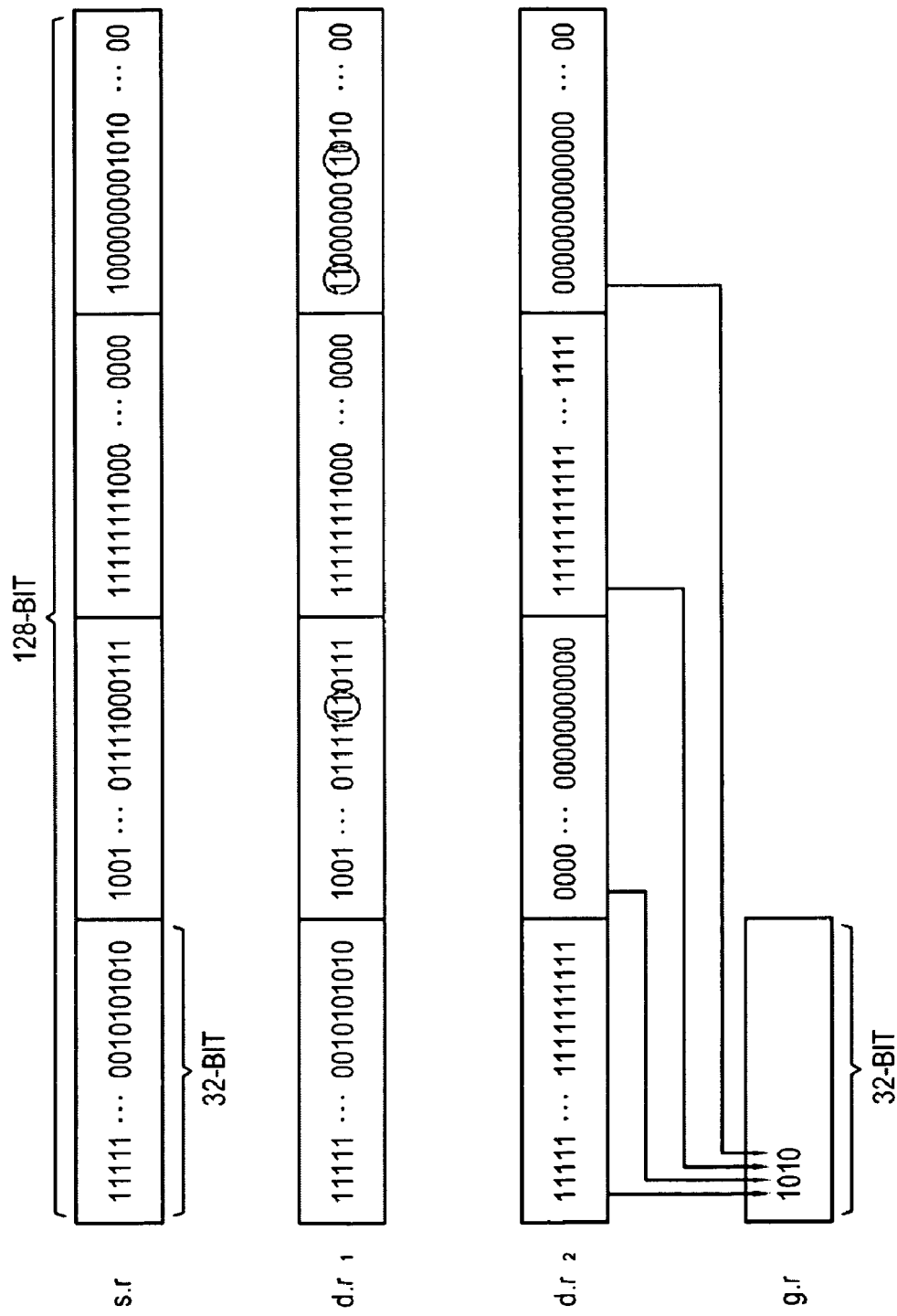
FIG. 2 is a structural diagram illustrating registers of a memory test device according to FIG. 1.
Figure 3:
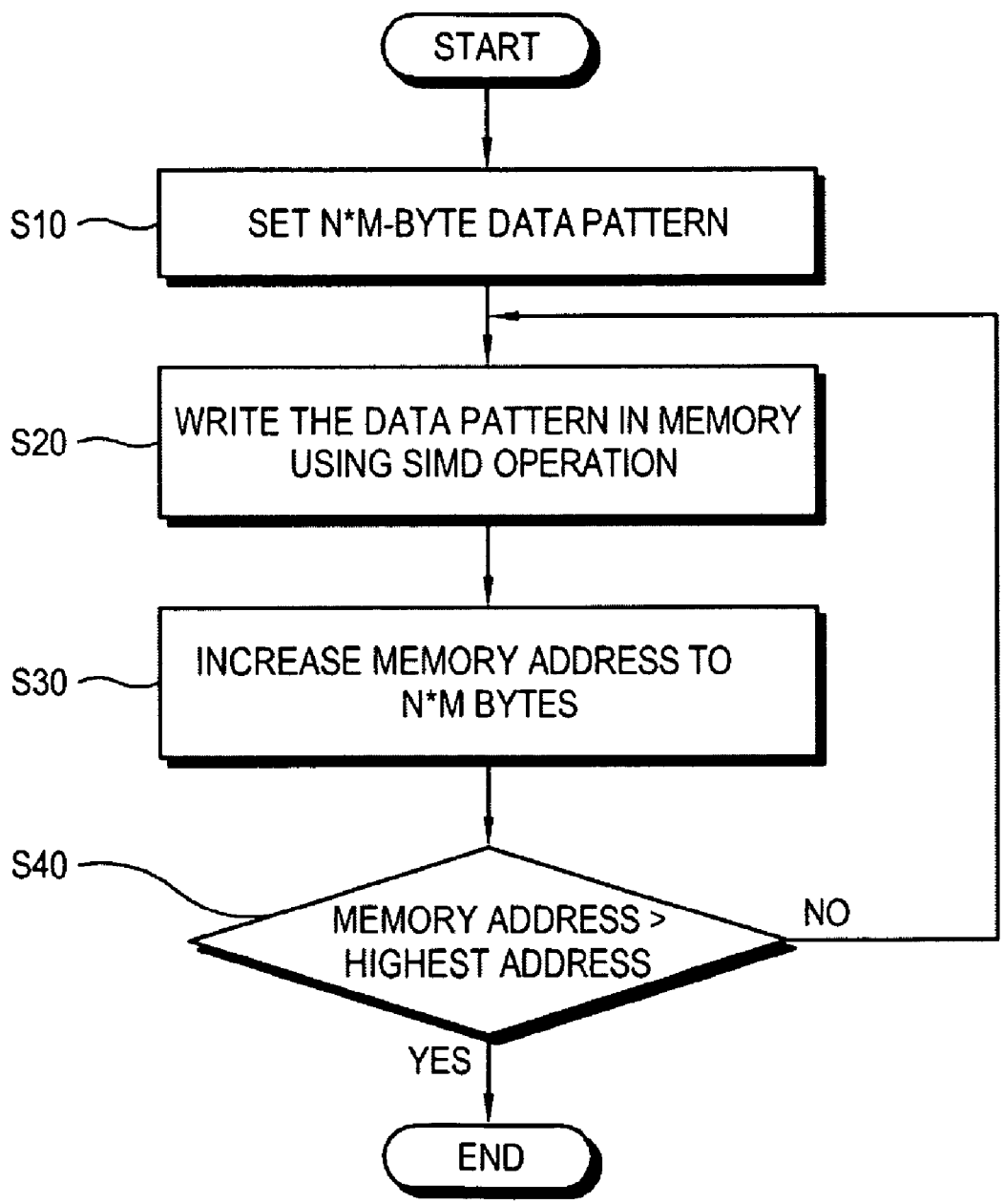
FIG. 3 is a control flow chart to explain a data pattern writing process of a memory test device according to FIG. 1.
Figure 4:
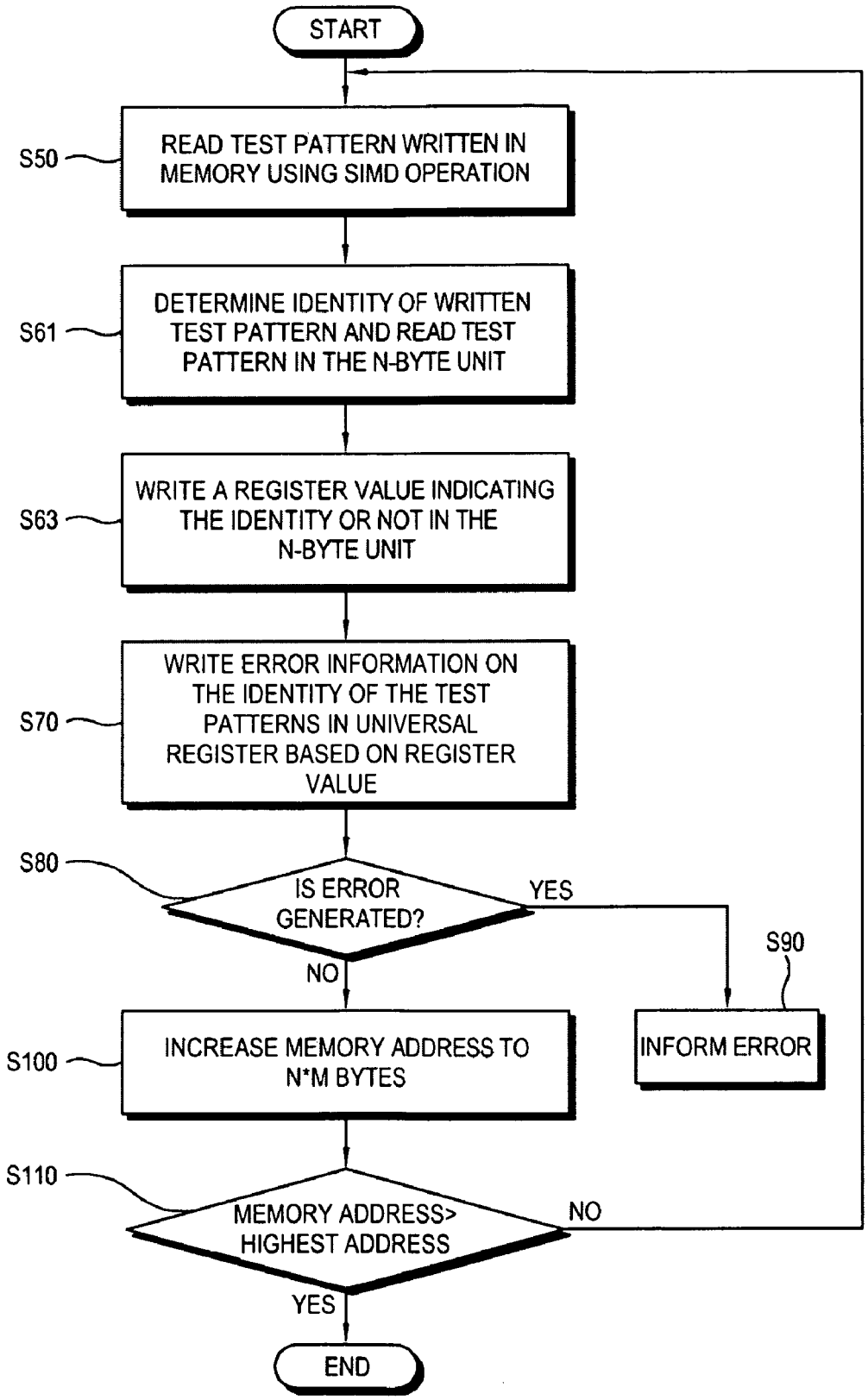
FIG. 4 is a control flow chart to explain a data pattern reading process of a memory test device according to FIG. 1.

FIG. 2 shows registers of a memory test device according to FIG. 1. FIG. 3 is a control flow chart to explain a data pattern writing process of a memory test device according to FIG. 1, and FIG. 4 is a control flow chart to explain a data pattern reading process of a memory test device according to FIG. 1.

Referring to FIG. 3, the controller 130 sets a data pattern to a specific register in the extension register 120 at operation S10. Because the N byte is 32 bits, the data pattern is N*4 bytes, or 128 bits. A register in the extension register 120, in which the test pattern is stored, is referred to as a source register (s.r). The source register does not refer to a specific register having a predetermined physical position or name.

The controller 130 writes the set data pattern in the lowest address 210 of the memory 200 using the SIMD operation at operation S20. Using the extension command language rather than the universal command language, the controller 130 writes a larger amount of data in the memory 200 at a time. Where the data pattern is written using the SIMD operation through the extension command language, the test time can be saved by 4 times at maximum, as compared to a conventional case of using the universal command language.

The controller 130 increases the address 210 of the memory 200 by N*M bytes, i.e., 128 bits, using the universal command language at operation S30. The controller 130 determines whether the address 210 of the memory 200 is the highest address having the highest value at operation S40. If the address 210 is the highest address, the controller 130 terminates writing of the data pattern. However, if the address 210 is lower than the highest address, the controller 130 returns back to the operation S20 and writes the data patterns in the increased address 210. The data patterns stored in the address 210 at a time may be different or identical. The controller 130 can sequentially and repetitively write a plurality of data patterns in the memory 200. After writing the data patterns from the lowest address to the highest address, the controller 130 executes a reading process as in FIG. 4.

According to another embodiment of the present invention, the controller 130 may pass through a reading process after having written the data patterns in the addresses by the predetermined unit, not in all the addresses (in this case, the data pattern may have 128 bits or an integral number of times of 128 bits.) After having read the data patterns as in FIG. 3 after the operation S20, the controller 130 increases the address of the memory 200.

If writing of the data pattern terminates, the controller 130 reads the data pattern written in the memory 200 into a first destination register (d.r$_1$) using the extension command language at operation S50 of FIG. 4.

The controller 130 determines in the unit of N byte, (32 bits) whether the test pattern written using the extension language, i.e., the test pattern set in the operation S10 of FIG. 3, is identical to the data pattern read in the first destination register ($d.r_1$) at operation S61. According to the determination result, the controller 130 writes a register value indicating the identity of the data patterns in a second destination register ($d.r_2$) at operation S63.

As shown in FIG. 2, data of the source register (s.r) and that of the first destination register ($d.r_1$) are identical as in the first 32-bit unit. In this case, a register value of "1" is written in the first 32-bit unit of the second destination register ($d.r_2$). However, if the data of the source register (s.r) and that of the first destination register ($d.r_1$) are not identical as in the second 32-bit unit (see the data values in the dotted circle), a register value of "0" is written in the second 32-bit unit of the second destination register ($d.r_2$). The identity of data patterns are compared in the N-byte unit and a register value indicating a result of the comparison is written in the N-byte unit. It is possible to change the register value written according to the identity. The controller 130 writes in a universal register 110 (g.r) a register value corresponding to a bit among the register values written in the N-byte unit, that is, the 32-bit unit at operation S70.

The current extension command language does not support a task to catch an error using a register value. Accordingly, the register value written in the extension register 120 should be written in the universal register 110 in the 32-bit unit, for a task by the universal command language. In this case, additional tasks 4-8 times more than the conventional task must actually be performed, which would lead to an increase in the test time.

However, only a register value of a single bit among the register values written in the second destination register ($d.r_2$) may be written in the universal register 110 (g.r), in order to reduce additional tasks that may be generated in writing and reading the data pattern using the extension register 120. A register value of MSB (most significant bit) or LSB (least significant bit) may be written. Through these tasks, tasks to write respective register values in the 32-bit unit can be performed by a one-time writing, and the efficiency of the memory test can be increased through a simple task.

The controller 130 determines whether any error is generated in the memory 200 using the universal command language, and catches the address 210 having the error generated therein at operation S80. As a result, if the register value is "0" and an error is generated, the controller 130 informs a user of the error at operation S90. If the register value is "1," the controller 130 increases the address 210 of the memory 200 by N*M bytes, i.e., 128 bits at operation S100. The controller 130 may display the address 210 having an error generated therein in such a manner that a user can recognize generation of the error, or may output a sound or an image to make the error known to the user.

The controller 130 determines, as in the operation S40 of FIG. 3, whether the address 210 of the memory 200 is the highest address having the highest value at operation S110. If the address 210 is the highest address, the controller 130 terminates reading of the data pattern. If the address 210 is lower than then highest address, the controller 130 returns back to the operation S50 and reads the data pattern in the increased address 210.

FIG. 5 is a table showing effects of a test memory method according to FIGS. 3 and 4. This table shows test results of a memory of DDR 2 PC5300, 1024 MB*1, made by Samsung Electronics Co., Ltd., using a central processing device according to the specification of Intel Core 2 Duo E6750 2.66 GHz as a memory test device.

Referring to the table, a first test is a "write" test that writes a data pattern in the memory. A second test and a third test are "read" tests that read the written test pattern. The second test uses a cache, an auxiliary storage device, between the central processing device and the memory. The third test reads the test pattern without using a cache. To compare the "write" times, it takes 1.87 seconds when the test patterns are written in the 32-bit unit, 1.22 seconds when the test patterns are written in the 64-bit unit, and 0.98 seconds when the test patterns are written in the 128-bit unit, showing a reduction in the writing times. As shown, an improved rate of the writing time is 47.6% and that of the speed is 90.8% in the 128-bit unit, in comparison with the 32-bit unit. In case of the "read" test using the cache, the reading time is improved by 61.1% and the speed is also increased by 157.1%, in comparison with the 32-bit unit. It can be known that as the bit number of the test patterns increases, the test time and speed also increases.

Fourth to seventh tests are classified according to the kind of test data written in the memory or a writing method, measuring the times consumed in the memory test. As algorithms and operations accompanied in the test processes may be different for each test, the times consumed in the memory test may differ. The fourth test writes and reads a specific pattern as described above. The "address line test" of the fifth test refers to sequentially writing and reading the address value of the memory from the lowest address to the highest address, but not writing and reading a specific test pattern in the memory. The sixth test refers to a "working I/O test" which writes and reads the test pattern moving by one bit as "1" or "0" as in "1000000000000 . . . ," "010000000000 . . . ," "00100000000 . . . ," etc. Last, the seventh test refers to writing and reading a lattice-shaped pattern similar to a chessboard. The fourth to seventh tests are all standardized tests. In case of the address line test consuming the lowest test time, the improved time rate is about 37% in the 64-bit unit, and about 66% in the 128-bit unit. In the 128-bit unit, the speed is greatly improved by about 200% or more, in comparison with the 32-bit unit. As shown in the table, where the memory tests are conducted using the 64-bit or 128-bit register rather than the 32-bit unit, a great improvement in time and speed can be obtained.

Aspects of the present invention reduce the time of repeated writing and reading of the test data using the extension general language supported by the test device 100. In addition, by reducing the tasks conducted in error detection, aspects of the present invention simplify a memory test algorithm. With these advantages, a large capacity of the memories can be more easily tested. In addition, as no additional configuration is required, compatibility and universality of the memory test can be maintained.

As described above, aspects of the present invention provide a memory test device and a memory test method that can reduce the test time. Aspects of the present invention also provide a memory test device and a memory test method, being excellent in compatibility and universality. In addition, aspects of the present invention provide a memory test device and a memory test method that can conduct the memory test through a simple task. Aspects of the present invention further provide a memory test device and a memory test method that can easily detect any error in a larger capacity of a memory.

Aspects of the present invention can also be embodied as computer readable codes on a computer readable recording medium. The computer readable recording medium is any data storage device that can store data which can be thereafter read by a computer system. Examples of the computer readable recording medium also include read-only memory (ROM), random-access memory (RAM), CDs, DVDs, Blu-ray discs, magnetic tapes, floppy disks, and optical data storage devices. Aspects of the present invention may also be embodied as carrier waves (such as data transmission through the Internet). The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A memory test device to test an external memory, comprising:
   a universal register to conduct an operation by a predetermined universal command language;
   an extension register having a larger capacity than the universal register, to conduct an operation by a predetermined extension command language; and
   a controller to write a predetermined test pattern in the external memory using the extension command language, to read the test pattern written in the memory, to compare the written test pattern and the read test pattern, and to determine a presence of an error in the external memory according to the comparison using the universal command language,
   wherein the universal register has a predetermined capacity of N bytes, where N is an integer, wherein the controller compares the written test pattern and the read test pattern in an N-byte unit, and wherein the size of units used for reading and writing the test pattern is larger than the size of the N-byte unit.

2. The memory test device of claim 1, wherein:
   the controller writes and reads the test pattern of N*M bytes, where M is an integer greater than 1.

3. The memory test device of claim 2, wherein the controller writes in the extension register a register value indicating whether the test patterns match as determined in the N-byte unit.

4. The memory test device of claim 3, wherein the controller writes in the universal register information whether the written test pattern matches the read test pattern or not, based on the register value written in the N-byte unit.

5. The memory test device of claim 4, wherein the controller writes in the universal register a register value of a single bit among the written N-byte register values.

6. The memory test device of claim 5, wherein the controller determines an address of the memory having an error generated therein, based on the register value written in the universal register.

7. The memory test device of claim 1, wherein the extension command language is realized by an single instruction multiple data (SMID) operation.

8. The memory test device of claim 1, wherein the extension command language comprises at least one of multimedia extension (MMX), streaming SIMD extension (SSE), SSE2, and SSE3.

9. The memory test device of claim 1, wherein the extension register comprises at least one of an MMX register and an extended memory manager (XMM) register.

10. A memory test method using a test memory device comprising a universal register to conducting an operation by a predetermined universal command language, wherein the universal register has a predetermined capacity of N bytes, where N is an integer, and an extension register having a larger capacity than the universal register to conduct an operation by a predetermined extension command language, the method comprising:
    writing a predetermined test pattern in an external memory using the extension command language;
    reading the test pattern written in the external memory using the extension command language,
       wherein the size of units used for reading and writing the test pattern is larger than the size of the N-byte unit;
    comparing the written test pattern and the read test pattern in an N-byte unit; and
    determining any error in the memory based on the comparison, using the universal command language.

11. The memory test method of claim 10, wherein:
    the writing of the test pattern comprises writing and reading the test pattern of N*M bytes, where M is an integer.

12. The memory test method of claim 11, wherein the comparing comprises:
    determining whether the written test pattern matches the read test pattern; and
    writing in the extension register a register value indicating whether the test patterns are identical as determined in the N-byte unit.

13. The memory test method of claim 12, wherein the determining of the error in the memory comprises:
    writing in the universal register information on the identity of the written test pattern and the read test pattern, based on the register value written in the N-byte unit; and
    determining an address of the external memory having an error generated therein based on the information written in the universal register.

14. A non-transitory computer readable medium comprising instructions that, when executed by a memory test apparatus, cause the memory test apparatus to perform the method of claim 10.

15. A memory testing method, comprising:
    writing a predetermined test pattern in a memory in units of greater than 32 bits;
    reading the test pattern from the memory in units of greater than 32 bits;
    comparing the predetermined test pattern and the read test pattern in an N-byte unit, wherein the size of the units used for reading and writing the test pattern is larger than the size of the N-byte unit; and
    determining the presence of an error in the memory based on the comparison between the predetermined test pattern and the read test pattern.

16. The memory testing method of claim 15, wherein the writing of the predetermined test pattern comprises writing the predetermined test pattern using an extension command language.

17. The memory testing method of claim 15, wherein the reading of the test pattern comprises reading the test pattern using a universal command language.

18. The memory testing method of claim 15, wherein the determining of the presence of the error comprises:
    comparing the predetermined test pattern and the read test pattern; and
    writing in an extension register a register value indicating a result of the comparison.

19. The memory testing method of claim 18, wherein the determining of the presence of the error further comprising:
   writing in a universal register information indicating the presence of the error, based on the register value written in the extension register; and
   determining an address of the memory having an error based on the information written in the universal register.

20. The memory testing method of claim 19, wherein:
   the information written in the universal register has a value of 0 if a corresponding memory address contains an error; and
   the information written in the universal register has a value of 1 if the corresponding memory address does not contain an error.

* * * * *